United States Patent [19]
Johnson

[11] Patent Number: 5,226,823
[45] Date of Patent: Jul. 13, 1993

[54] INDEXING MECHANISM FOR PRECISION ALIGNMENT OF ELECTRICAL CONTACTS

[75] Inventor: Donald L. Johnson, Fallbrook, Calif.

[73] Assignee: Teledyne Kinectics, San Diego, Calif.

[21] Appl. No.: 819,081

[22] Filed: Jan. 9, 1992

[51] Int. Cl.$^5$ .............................................. H01R 9/09
[52] U.S. Cl. ....................................... 439/66; 439/69; 439/71
[58] Field of Search ................ 439/66, 69, 70, 71, 439/74, 75, 91, 591, 912

[56] References Cited

U.S. PATENT DOCUMENTS

| | | | |
|---|---|---|---|
| 3,140,907 | 7/1964 | Davies | 339/17 |
| 3,173,732 | 3/1965 | James | 339/17 |
| 3,215,968 | 11/1965 | Herrinann | 339/17 |
| 3,500,285 | 3/1970 | Jones et al. | 339/17 |
| 3,518,612 | 6/1970 | Dunman et al. | 339/19 |
| 3,795,037 | 3/1974 | Luttmer | 29/628 |
| 3,795,884 | 3/1974 | Kotaka | 339/17 |
| 3,829,817 | 8/1974 | Beavitt | 339/17 |
| 3,858,154 | 12/1974 | William | 339/17 |
| 3,858,961 | 1/1975 | Goodman et al. | 339/176 |
| 3,960,424 | 6/1976 | Weisenburger | 339/17 |
| 3,992,051 | 11/1975 | Reynolds | 339/17 |
| 3,993,384 | 11/1976 | Dennis | 439/71 |
| 4,003,621 | 1/1977 | Lamp | 339/59 |
| 4,021,091 | 5/1977 | Anhalt et al. | 339/75 |
| 4,159,154 | 6/1979 | Arnold | 339/74 |
| 4,204,205 | 5/1980 | Yagi et al. | 340/719 |
| 4,295,700 | 10/1981 | Sado | 339/61 |
| 4,395,084 | 7/1983 | Conrad | 439/331 |
| 4,402,562 | 9/1983 | Sado | 339/61 |
| 4,445,735 | 5/1984 | Bonnefoy | 339/17 |
| 4,508,398 | 4/1985 | Stepan et al. | 339/17 |
| 4,521,065 | 6/1985 | Nestor et al. | 339/75 |
| 4,575,175 | 3/1986 | Wilson | 339/176 |
| 4,577,922 | 3/1986 | Stipanuk et al. | 339/176 |
| 4,699,593 | 10/1987 | Grabbe et al. | 439/71 |
| 4,715,820 | 12/1987 | Andrews, Jr. et al. | 439/59 |
| 4,738,625 | 4/1988 | Burton et al. | 439/59 |
| 4,867,689 | 9/1989 | Redmond et al. | 439/71 |
| 4,976,629 | 12/1990 | Werner | 439/259 |
| 4,998,886 | 3/1991 | Werner | 439/66 |

OTHER PUBLICATIONS

Leonard Buchoff, *Guidelines for Designing Elastomeric Connectors Into the System*, Connection Technology, Aug. 1987.

PCK Elastomerics, Inc., *Carbon Stax Elastomeric Connectors*, Technical Data Sheet.

*Contact Systems*, from article in Connection Technology, p. 44, Dec. 1988.

Amp Incorporated, *Interposer Multichip Socket*, from article by AMP Incorporated in 1988.

*Primary Examiner*—Neil Abrams
*Attorney, Agent, or Firm*—Nydegger & Associates

[57] ABSTRACT

An indexing mechanism for precision alignment of stacked electronic substrates includes a post associated with a stackable connector and a notch associated with an electronic substrate engaging the connector. The notch is provided to receive the post when the substrate is positioned between two connectors in an assembly thereof. Placement of the post in the notch automatically aligns the electrical contacts of the connector and substrate in their correctly indexed sequence. Connectors can be added to the assembly and additional substrates inserted between any pair of juxtaposed connectors. The indexing mechanism enables precision alignment of any number of substrates in the stacked configuration.

14 Claims, 3 Drawing Sheets

INDEXING MECHANISM FOR PRECISION ALIGNMENT OF ELECTRICAL CONTACTS

FIELD OF THE INVENTION

The invention relates to a method and apparatus for electrically connecting a plurality of electronic substrates and more particularly to a method and apparatus for electrically connecting a plurality of electronic substrates in an assembly of stackable connectors.

BACKGROUND OF THE INVENTION

Stackable connectors having a plurality of electrical contacts are commonly employed to electrically connect electronic substrates. One such stackable connector is disclosed in U.S. Pat. No. 4,395,084 to Conrad. The effectiveness of a stackable connector is dependent on the integrity of the electrical connection it provides. Torsional forces on a stackable connector can cause the electrical contacts of the connector to misalign with respect to the electrical contacts of the substrate. The problem is particularly acute when the contacts of several substrates and connectors, stacked in a single assembly are misaligned creating significant tolerance accumulation. The problem is manifested in poor electrical connections or even total loss of electrical connections.

As such, a method and apparatus are needed to enhance the integrity of the electrical connection between electronic substrates. Particularly, a method and apparatus are needed to provide precision alignment between the electrical contacts of an electronic substrate and the electrical contacts of a stackable connector employed to electrically connect the substrate with other substrates. More particularly, a method and apparatus are needed to provide precision alignment between the electrical contacts of a plurality of stackable connectors and the electrical contacts of a plurality of electronic substrates stacked together in a unitary assembly.

SUMMARY OF THE INVENTION

The present invention is a method and apparatus for providing a reliable electrical connection between an electronic substrate and a stackable connector. Further, the present invention provides for precision alignment between a plurality of electronic substrates and a plurality of such bodies stacked together in a unitary assembly. Stated differently, the present invention provides for precision alignment between the electrical contacts of first and second electronic substrates and the electrical contacts of a connector positioned between the two substrates. As implied, a third electronic substrate may subsequently be electrically connected to the second electronic substrate by positioning a second connector therebetween and aligning the electrical contacts of the second and third substrates with the contacts of the second connector. Ultimately, as many electronic substrates as desired may be stacked in an assembly of connectors and electrically connected using the present invention. The invention is particularly useful for minimizing tolerance accumulation in an assembly having a relatively large number of stackable connectors and substrates housed therein.

The apparatus of the present invention includes an indexing mechanism comprising a post associated with a stackable connector and a notch formed in a substrate. The notch is provided in the substrate to receive the post when the substrate is stacked against the connector. In accordance with the present invention, placement of the post in the notch automatically indexes the electrical contacts of the connector with the electrical contacts of the substrate.

In the preferred embodiment of the invention, the post is an elongated member extending from a body which slidably engages a rail integral to the frame of the connector. The notch is an indentation in the substrate, and more specifically, a recess formed peripherally in the substrate surface. The substrate supports electrical contacts arranged on its surface which engage the electrical contacts of the connector body when the substrate is secured to the connector.

The post and notch are positioned on the body and substrate respectively so that the post aligns with and fits closely with the notch when the substrate is properly positioned in an assembly of connectors and substrates. Placement of the post in the notch results in a precision alignment between the electrical contacts of the connector and substrate in the assembly. Thus, the integrity of the electrical connection between electronic substrates connected across the assembly is ensured when the indexing mechanism is utilized.

The novel features of this invention, as well as the invention itself, both as to its structure and its operation, will be best understood from the accompanying drawing, taken in conjunction with the accompanying description, in which similar reference characters refer to similar parts, and in which:

DESCRIPTION OF PREFERRED EMBODIMENTS

Figure 1:
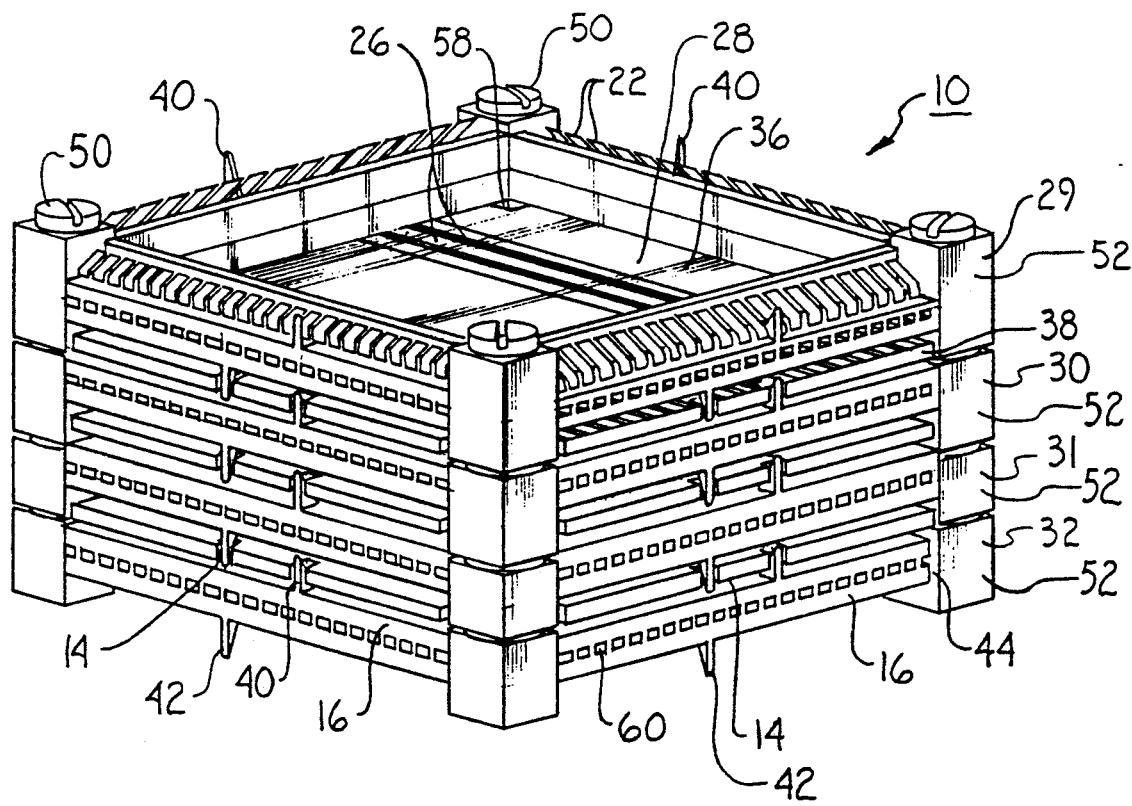
FIG. 1 is a perspective view of an assembly of stackable connectors and substrates having the indexing mechanism of the present invention.
Figure 2:
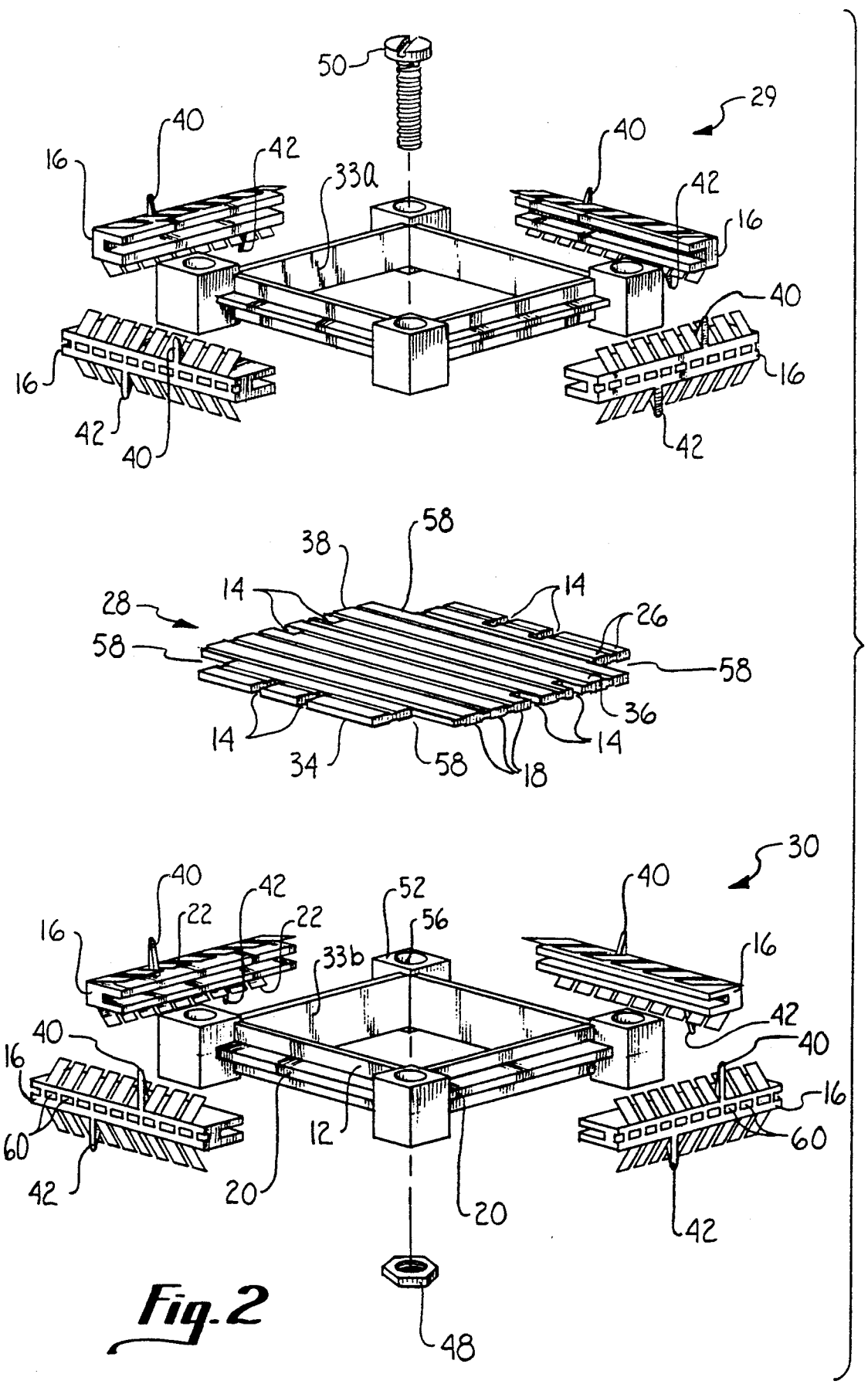
FIG. 2 is an exploded perspective view of an assembly housing a single substrate.
Figure 3:
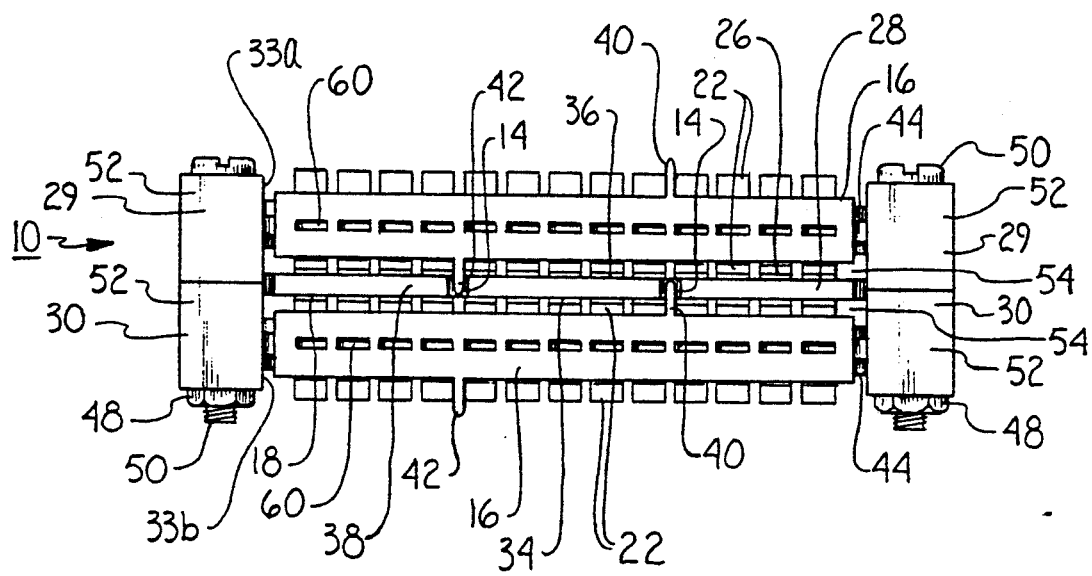
FIG. 3 is a side elevation view of the unitary assembly shown in FIG. 2.

FIGS. 1 through 3 show a plurality of indexing mechanisms as they are employed in conjunction with a stacked assembly of connectors and substrates generally designated 10. Referring to FIG. 1, each indexing mechanism comprises an upward post 40 or a downward post 42 which is associated with stackable connector 29, 30, 31, or 32, and further comprises a notch 14 which is associated With a substrate 28. Posts 40, 42 and notches 14 are designed to closely engage each other when substrate 28 and stackable connectors 29, 30, 31, 32 are secured in assembly 10.

As used herein, the term substrate refers generally to any substantially planar medium having electrical components mounted thereon, such as a leadless integrated circuit, a printed circuit board, or other such substrates known in the art. In a preferred embodiment demonstrated by FIGS. 2 and 3, posts 40, 42 are mounted on a body 16 which is detachably affixable to frame 33b of connector 30 by means of a rail 20 provided on the outer edge 12 of frame 33b. Body 16 also has electrical connector contacts 22 mounted thereto. Body 16 is provided with a plurality of windows 60 in its surface to enable electrical access to each connector contact 22 through body 16. It is apparent that this description applies likewise to frame 33a of connector 29.

Connector contacts 22 are a series of thin and resilient conductive metal strips which are molded directly into the structure of body 16. Connector contacts 22 are oriented substantially away from the axis of body 16 and are initially in an unstressed condition as shown by the solid line in FIG. 4. Unstressed connector contacts 22 are also shown positioned on the upper side of connector 29 and the lower side of connector 30 in FIG. 3.

Figure 4:
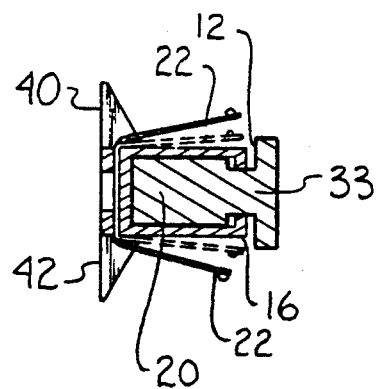
FIG. 4 is a cross-sectional view of the connector body showing both the stressed and unstressed conditions thereof.

When body 16 is incorporated into stacking assembly 10 and connector contacts 22 engage upper contacts 26 and lower contacts 18 of substrate 28 in a manner described hereafter, connector contacts 22 assume a stressed condition as shown by the broken line in FIG. 4. Stressed connector contacts are further shown positioned on the lower side of connector 29 and the upper side of connector 30 in FIG. 3.

Posts 40, 42 are oriented substantially perpendicular to the axis of body 16. The height of posts 40, 42 is such that it exceeds the height of the stressed connector contacts 22. The greater height of posts 40, 42 enables them to engage notches 14 when substrate 28 is secured in assembly 10.

Body 16 can be affixed to frame 33 by fabricating body 16 from a resilient material having a C-shaped cross section which engages a T-shaped cross section of rail 20 as substantially shown in FIG. 4. Body 16 is attached to frame 33 by snapping its C-section over the T-section of rail 20 and conversely body 16 is detached from frame 33 by prying its C-section away from the T-section of rail 20.

An exemplary assembly of stackable connectors having a body and rail configuration with which the indexing mechanism of the present invention can be associated is described in U.S. Pat. No. 4,395,084 to Conrad, incorporated herein by reference.

Substrate 28 preferably has a flat top surface 36 and a flat bottom surface 34. Top surface 36 supports the plurality of electrical contacts 26 near the substrate periphery 38. Bottom surface 34 likewise supports the plurality of electrical contacts 18 near the substrate periphery 38. Electrical contacts 18, 26 of the substrate 28 are termed contact pads. Contact pads 18, 26 shown in FIGS. 1 through 3 are arranged in a predetermined pattern of regular fixed intervals. However, substantially any pattern known to those skilled in the art is possible in the practice of the present invention.

Notches 14 are recesses formed in the substrate periphery 38 and are provided to receive posts 40, 42 in close fitting relation when substrate 28 is secured in assembly 10. The position of notches 14 in substrate 28 is such that When the posts 40, 42 fit into notches 14, a precision alignment is simultaneously achieved between contacts 22 of connectors 40, 42 and contact pads 18, 26 on substrate 28 in a manner which is apparent from a description of the method of the present invention set forth below with reference to FIGS. 2 and 3. The method is initiated by attaching a body 16 to each rail 20 of frames 33a, 33b. Frames 33a, 33b are preferably rectangular-shaped and more preferably square-shaped. Thus, preferred frames 33a, 33b each have four rails 20, one on each side, to accommodate four bodies 16.

The method proceeds by sandwiching a single substrate 28 between the frames 33a, 33b of upper and lower connectors 29, 30, respectively. Frames 33a, 33b are preferably sized in correlation to substrate 28 as well as to each other so that frames 33a, 33b circumscribe substrate 28 when it is inserted between them.

The frames 33a, 33b of connectors 29, 30 and intervening substrate 28 are then joined by engaging the posts 40, 42 and notches 14 of the indexing mechanisms while stressing connector contacts 22 against substrate 28 until frames 33a, 33b abut at their four cornermounts 52. Since each body 16 is provided with a post 40 extending in an upward direction and an opposing post 42 extending in a downward direction, connector 29 has four posts 42 extending downward which engage their corresponding notches 14 in substrate 28, and connector 30 has four posts 40 extending upward which likewise engage their corresponding notches 14 in substrate 28.

Each notch 14 and each post 40, 42 is preferably provided at a corresponding slightly off-center position of substrate 28 and body 16 respectively so that downward posts 42 of upper connector 29 do not interfere with upward posts 40 of lower connector 30 when posts 40, 42 engage notches 14 in substrate 28 from opposing directions. Importantly, however, notches 14 and posts 40, 42 are substantially near the center of the substrate periphery 38 in order to minimize deviations between contacts 22 and 26.

Engagement of posts 40, 42 and notches 14 is further facilitated by providing rail 20 with a length Which is slightly greater than the length of body 16 attached thereto. Thus, body 16 is slidable along the excess length 44 of rail 20 which enables the user to more readily place posts 40, 42 in the notches 14 when fitting substrate 28 between frames 33a, 33b.

Once the connectors 29, 30 and substrate are joined, a fastening means, such as the nut 48 and bolt 50 couplet shown, is provided to fix frames 33a, 33b in position relative to one another and to substrate 28. Bolts 50 fit through openings 56 provided in cornermounts 52 and through cut-outs 58 provided at the corners of substrate 28. Fastened frames 33a, 33b in concert with stressed connector contacts 22 secure substrate 28 in assembly 10.

Because cornermounts 52 extend above and below body 16 when attached to rail 20, frame gaps 54 are provided between frames 33a, 33b and substrate 28 when they are joined and cornermounts 52 abut. Frame gaps 54 enable the flow of cooling ventilation air through assembly 10 and across top surface 36 and bottom surface 34 of substrate 28 during operation. Nevertheless, the height of frame gaps 54 is set substantially less than the height of unstressed connector contacts 22 to enable stressing of the connector contacts 22 against substrate 28 when joining the frames 33a, 33b.

Figure 5:
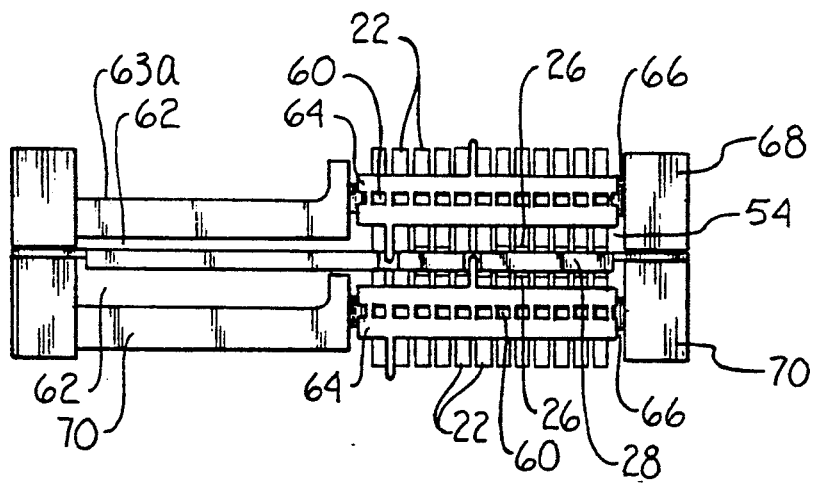
FIG. 5 is a side elevation view of an embodiment of the assembly having contact gaps provided therein.

As shown in the embodiment of FIG. 5, additional air gaps 62 may be provided between substrate 28 and frames 63a, 63b of upper and lower connectors 68 and 70 respectively, by providing bodies 64 and corresponding rails 66 which are substantially shorter in length than frames 63a, 63b. Contact gaps 62 result from the absence of connector contacts 22 along the portion of frames 63a, 63b not occupied by bodies 64. Connectors 68, 70 may be incorporated into assembly 10 of FIG. 1 in place of connectors 29, 30, 31, 32 wherever it is desired to provide contact gaps 62 in assembly 10 for purposes such as providing an enhanced air-cooling capacity for assembly 10.

Referring again to FIG. 2, it is apparent that when each of downward posts 42 is engaged with its corresponding notch 14, all abutting connector contacts 22 supported by frame 33a of upper connector 29 are indexed in their proper sequence and are precisely aligned with contact pads 26 on top substrate surface 36. In a like manner, when upward posts 40 engage their respective notches 14, connector contacts 22 supported by the frame 33b of lower connector 30 are indexed in their proper sequence and are precisely aligned with contact pads 18 on bottom substrate surface 34. Consequently when the frames 33a, 33b are fastened, stressed connector contacts 22 are firmly pressed against contact pads 18, 26 and provide a secure electrical connection in accordance with the objectives of the present invention.

Although the present invention has been described above with reference to a single substrate secured between a pair of connectors, the invention applies likewise to a plurality of substrates housed within an assembly of three or more connectors as shown in FIG. 1. Multiple substrates can be secured within a single assembly by stacking the substrates atop one another, providing intervening connectors between each substrate, and aligning and fastening the substrates in the same manner as described above. For a given assembly, there will be n+1 connectors where n is equal to the number of packages housed in the assembly.

Accordingly, it is within the scope of the present invention to electrically connect any desired number of substrates to one another across a single stacked assembly simply by utilizing additional connectors. For this reason, the present invention has particular utility in the manufacture of large scale integrated circuits (LSIC) which include many substrates in a single stacking assembly.

While the particular indexing mechanism as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

I claim:

1. An indexing mechanism for electrically engaging a first plurality of connector contacts with a first plurality of contact pads which comprises:
   a substrate having a first surface, said first surface supporting said first plurality of contact pads, said substrate having a periphery and having a notch formed on said periphery;
   a first frame formed with a rail;
   a body supporting said first plurality of connector contacts, said body being engageable with said rail; and
   a post mounted on said body and engageable with said notch to electrically align said first plurality of contact pads with said first plurality of connector contacts;
   a second surface on said substrate, said second surface supporting a second plurality of contact pads thereon;
   a second frame formed with a second rail;
   a second body supporting a second plurality of connector contacts, said second body being slidably engageable with said second rail;
   a second post mounted on said second body and engageable with a second notch on said periphery of said substrate; and
   means for fastening said second frame to said first frame, thereby securing the electrical alignment of said first plurality of contact pads and said first plurality of connector contacts, and further securing the electrical alignment of said second plurality of contact pads and said second plurality of connector contacts.

2. An indexing mechanism as recited in claim 1 wherein said substrate is a polygon with said periphery of said substrate defining a plurality of edges, each said edge having at least one said notch formed therein, and wherein said first frame has a plurality of sides with each said side corresponding to a respective edge of said substrate and each said side being formed with a rail engageable with a respective body.

3. An indexing mechanism as recited in claim 2 wherein said substrate is a rectangle and said frame is four-sided.

4. An indexing mechanism as recited in claim 1 wherein said body is elongated and said post is mounted near, but not at, the center of said body.

5. An indexing mechanism as recited in claim 1 wherein said first frame is formed with a gap where said first frame juxtaposes said substrate to permit air flow across said substrate.

6. An indexing mechanism as recited in claim 1 further comprising a plurality of said substrates, each said substrate being positionable between two juxtaposed frames to establish electrical connections between said plurality of contact pads supported by said substrates by said respective bodies.

7. An indexing mechanism for electrically engaging a first plurality of connector contacts with a first plurality of contact pads which comprises:
   a substrate supporting said first plurality of contact pads, said substrate having a periphery and having a notch formed on said periphery;
   a first frame formed with a rail;
   a body supporting said first plurality of connector contacts, said body being substantially C-shaped for straddling engagement with said rail; and
   a post mounted on said body and engageable with said notch to electrically align said first plurality of contact pads with said first plurality of connector contacts.

8. An indexing mechanism as recited in claim 7 wherein said rail is T-shaped for receiving said C-shaped body.

9. An indexing mechanism as recited in claim 7 wherein said body is formed with a plurality of windows, each said window providing electrical access to one of said connector contacts.

10. A method for aligning a plurality of connector contacts supported by a first stackable connector with a plurality of contact pads supported by a surface of a substrate engaging said first connector, the method comprising:
   engaging a post supported by said first connector with a notch formed in said substrate to effect a predetermined alignment between said plurality of connector contacts and said plurality of contact pads;
   stressing said plurality of connector contacts against said surface of said substrate;
   engaging said plurality of connector contacts with said plurality of contact pads to provide electrical connections therebetween corresponding to said predetermined alignment;

securing said first stackable connector in fixed relation to said substrate thereby fixing said predetermined alignment;

aligning a second plurality of connector contacts supported by a second connector with a second plurality of contact pads supported by an opposing surface of said substrate engaging said first connector;

engaging a second post supported by said first connector with a second notch formed in said substrate to effect a second predetermined alignment between said second plurality of connector contacts and said second plurality of contact pads;

stressing said second plurality of connector contacts against said opposing surface of said substrate;

engaging said second plurality of connector contacts with said second plurality of contact pads to provide electrical connections therebetween corresponding to said predetermined alignment; and securing said second connector in fixed relation to said substrate and said first connector thereby fixing said predetermined alignment.

11. The method of claim 10 wherein said connector contacts and post are mounted on a body engaging a rail formed on a frame of said connector.

12. The method of claim 11 wherein said body engages said rail to facilitate engagement of said post with said notch.

13. The method of claim 11 wherein said second frame is secured in fixed relation to said first connector and substrate by joining said first connector to said second connector with said substrate positioned therebetween.

14. The method of claim 11 wherein a plurality of said substrates are housed within an assembly of substrates and connectors by positioning frames on opposing sides of each said substrate to provide alignment for electrical connections between said plurality of contact pads supported by each said substrate and said plurality of connector contacts supported by each said connector.

* * * * *